ELASTIC WAVE GENERATOR

Filed Dec. 29, 1965 2 Sheets-Sheet 1

INVENTORS C. F. QUATE
P. K. TIEN
BY Roy M. Porter, Jr.
ATTORNEY

Nov. 12, 1968 C. F. QUATE ET AL 3,411,023

ELASTIC WAVE GENERATOR

Filed Dec. 29. 1965 2 Sheets-Sheet 2

United States Patent Office 3,411,023

Patented Nov. 12, 1968

3,411,023

ELASTIC WAVE GENERATOR

Calvin F. Quate, Los Altos Hills, Calif., and Ping K. Tien, Chatham Township, Morris County, N.J.; said Tien assignor to Bell Telephone Laboratories, Incorporated, New York, N.Y., a corporation of New York Filed Dec. 29, 1965, Ser. No. 517,216
9 Claims. (Cl. 310—8)

ABSTRACT OF THE DISCLOSURE

An elastic wave generator in which noise present in a solid state elastic wave amplifier having no input is synchronized into a plurality of parametrically coupled coherent modes of oscillation by a low level, low frequency signal that is a submultiple of the desired signal to provide a high power, high efficiency source of elastic waves. The synchronizing signal may be superimposed, for example, upon the direct current biasing field.

This invention relates to elastic wave devices and more particularly to solid state generation of elastic wave energy.

Elastic wave energy has usually been generated heretofore by transducers which convert a driving electrical signal of a given frequency into an elastic wave at the same frequency but with an energy level reduced from the energy level of the driving signal by the inefficiency of the transducers. Thus, in order to generate a high level elastic wave at a microwave frequency, one must first have available an electrical microwave signal of even higher level.

It is, therefore, an object of the present invention to generate high level, high frequency elastic wave energy. More particularly, it is an object to convert a low level, low frequency, electrical signal into an elastic wave signal having both a frequency and a level many times that of the driving signal.

In accordance with the present invention unique advantage is taken of a heretofore undesirable phenomena present in solid state elastic wave amplifiers. The basic elastic wave amplifier was disclosed by D. L. White in United States Patent 3,173,100, granted Mar. 9, 1965 and in an article on p. 237 of volume 7 of the Physical Review Letters (1961). It was pointed out that an elastic wave propagating through a high resistivity piezoelectric semiconductor under the influence of a proper external DC bias, grows in amplitude as the wave propagates.

The desired amplification was accompanied by a generally undesirable phenomena which has been referred to as an ultrasonic flux buildup in the amplifier. This flux buildup is described by J. H. McFee on p. 1548 of volume 34 of the Journal of Applied Physics (1963) and comprises a random oscillation that originates from repeated amplification of noise. The oscillation builds up simultaneously over a wide spectrum of frequencies which have amplitudes and phases varying in time incoherently with each other. The signal generated is useless for practical applications and degrades the performance of the device as an amplifier. Means have been proposed, as for example, in the copending application of J. H. Rowen and D. L. White, Ser. No. 275,059, filed Apr. 23, 1953, to reduce the effect of flux buildup.

In accordance with the present invention, it has been found that a low level alternating current field of a critical low frequency applied with, superimposed or modulated upon the DC field will cause the flux to build up as a plurality of coherent modes of oscillation. These modes are tightly coupled through parametric interaction so that elastic wave power taken out of the generator at the frequency of one mode will be derived from or supplied by all the coherent modes.

These and other objects and features, the nature of the present invention and its various advantages, will appear more fully upon consideration of the specific illustrative embodiments shown in the accompanying drawings and described in detail in the following explanation of these drawings, in which.

Figure 1:
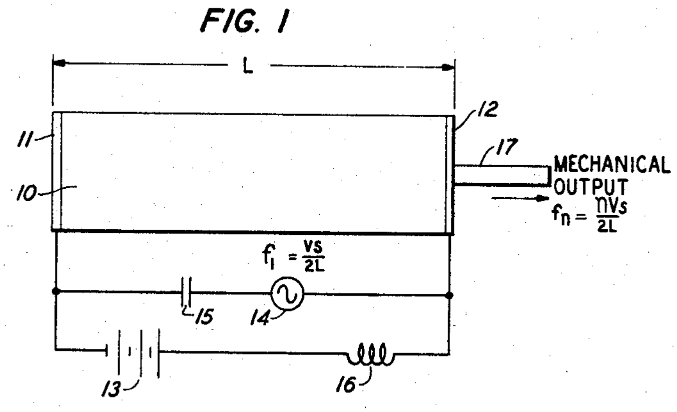
FIG. 1 is a schematic view of an elastic wave generator according to the invention.

Referring more particularly to FIG. 1, an illustrative embodiment of an elastic wave generator is shown schematically. Body 10 comprises an elongated member of length L of high resistivity, piezoelectric, semiconductive material of one of the compositions described as suitable in the above-mentioned patent. Specifically, these materials include ones from Group III–V, such as gallium arsenide, gallium phosphide or indium arsenide or from Group II–VI, such as cadmium sulphide, cadmium selenide, cadmium telluride, zinc oxide or zinc selenide. It is preferable, although not necessary, that any of these materials be in single crystal form.

Each end of body 10 is provided with ohmic contacts 11 and 12. A direct current bias derived from source 13 and an alternating drive of frequency $f_1$ from source 14 are applied in parallel with each other to contacts 11 and 12. The direct current from source 13 is isolated from source 14 by capacitor 15 in series with source 14 and the alternating current from source 14 is isolated from source 13 by inductor 16 in series with source 13.

Mechanical means for coupling elastic waves from body 10 are illustrated by rod 17 rigidly connected to the backside of contact 12 as will be described in more detail hereinafter.

Figure 2:
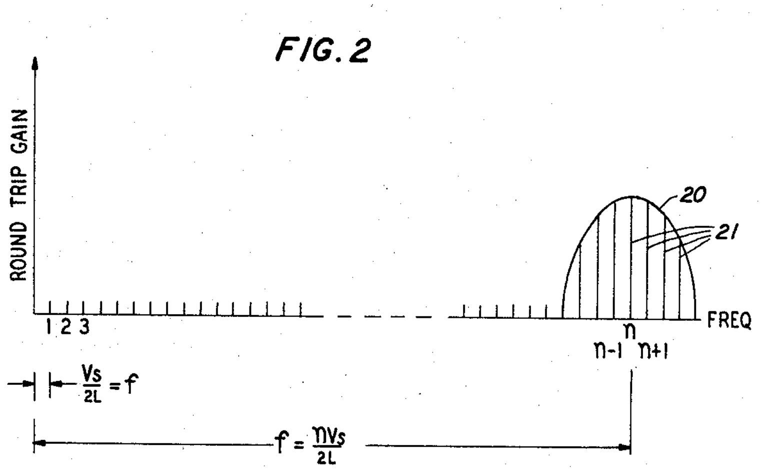
FIG. 2 is a plot of the round-trip gain vs. frequency of a solid state amplifier and illustrates the relative magnitudes of parameters in accordance with the invention.

Operation in accordance with the invention may be understood from FIG. 2. Curve 20 represents the round-trip gain vs. frequency characteristic of a typical amplifier as disclosed by White. A given piezoelectric semiconductor under the influence of a direct current field will have maximum gain at a given frequency when the average drift velocity of the carriers in the semiconductor responsive to the DC field exceeds the velocity of sound in the medium. A backward travelling wave, such as that produced by reflection, has a negative velocity ratio that produces a loss that is generally less than the forward gain. Thus in a band typically represented by curve 20, the round-trip gain expressed in decibels is greater than zero and any disturbance in the system, such as thermal noise, will rapidly build up into a random, incoherent and spontaneous oscillation at frequencies within the band. Since the length L of body 10 is many elastic wavelengths, the band of spontaneous oscillation includes a large number of frequencies for which an integral multiple of half wavelengths fit exactly into the length L. These frequencies represent the possible resonant modes of oscillation of the system and are shown by the lines 21 in FIG. 2. The frequency of a typical one may be expressed $f_1=nv_s/2L$ where $n$ is the number of integral wavelengths in a round trip of the ultrasonic wave and $v_s$ is the velocity of sound in the medium. These frequencies are in effect high harmonics of some low frequency $f_1$ which would have a frequency equal to $v_s/2L$ except that $f_1$ is outside the amplification band 20 and probably also too low to be supported as an elastic wave. The frequency $f_1$ is also the frequency spacing between various frequencies $f_{n-1}$, $f_n$, $f_{n+1}$, etc.

In accordance with the invention it has been recognized that when the frequency $f_1$ is suitably superimposed upon the system, modes of oscillation at frequencies $f_{n-1}$, $f_n$, and $f_{n+1}$ within the amplification band 20 build up to the exclusion of other oscillations, have phases that are related to each other by $\pi$ degrees and amplitudes that bear a fixed relationship to each other.

An oversimplified, qualitative understanding of the phenomenon may be had by considering the signal from source 14 as varying the gain of the elastic wave path at the frequency $f_1$ and therefore acting as a synchronizing signal effective as to all modes of oscillation. Since the period of $f_1$ is the time required for the elastic wave of any of the modes of oscillation to travel twice the length of body 10, each transit of waves has the same phase with $f_1$. Successive transits of the wave train of each mode along the length of body 10 results in successive reinforcement until all modes reach a well defined amplitude and phase. The condition can thereafter be referred to as "locked". Furthermore, these several modes are tightly coupled to each other parametrically through nonlinear interaction in the piezoelectric medium. Since they are tightly coupled, power withdrawn from the system at one frequency will be derived from all modes of oscillation. The phenomenon is therefore similar to what has been called synchronous modulation of optical masers.

Figure 3:
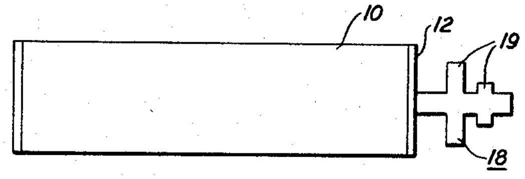
FIG. 3 illustrates a modification of a portion of FIG. 1 in accordance with a specific embodiment of the invention.

A simple rod, such as 17, will couple out all of the synchronized modes 21 under curve 20 as a plurality of spaced, coherent, discrete bands of frequency. However, if rod 17 is replaced by any suitable mechanical bandpass filter, tuned to the frequency of only one of these modes, the output power withdrawn will be a single frequency corresponding to that one mode. The power, however, will be that available from all modes since power will be transferred parametrically into the one being withdrawn from those not directly coupled. The use of such a resonant couple is illustrated in FIG. 3 wherein the member 18 is of the type disclosed in W. P. Mason Patents 2,354,491, granted Mar. 28, 1944 or 2,342,831, granted Feb. 29, 1944. The transverse members 19, either formed as crossbars or as discs, have dimensions as disclosed by Mason which make them antiresonant at the respective limits of the pass band. Obviously, this particular form is merely illustrative, and equivalent forms of mechanical filters known to the art may be used. The selected output frequency may be changed merely by changing the resonant frequency of the coupling means so long as the selected output corresponds to one of the synchronized modes 21. Further it should be apparent that either rod 17 or 18 can in turn be coupled to any known electromechanical transducer, either tuned or untuned, to convert the elastic wave power into electromagnetic wave power.

Figure 4:
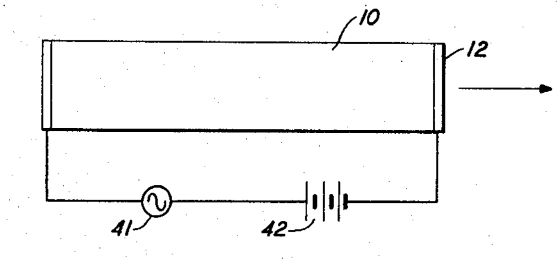
FIGS. 4 through 7 illustrate alternative ways in which the alternating current and direct current fields may be superimposed upon each other in accordance with the invention.
Figure 5:
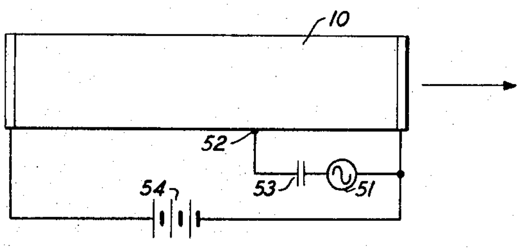
Figure 6:
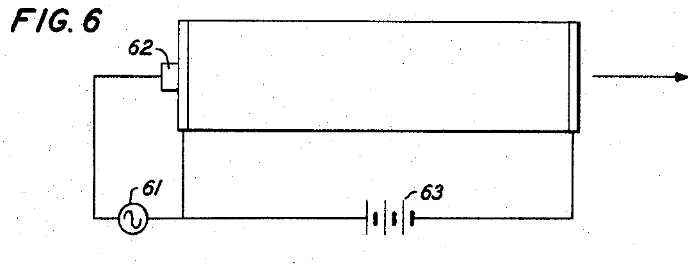
Figure 7:
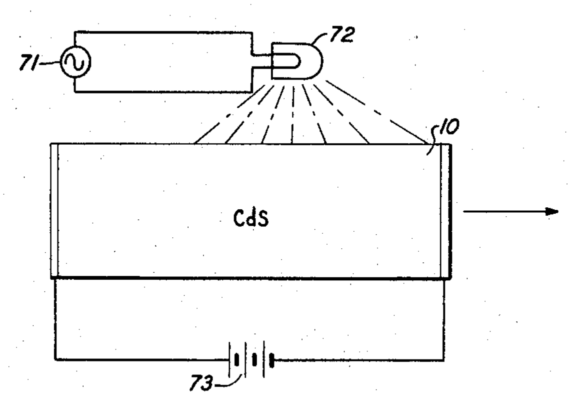

The synchronizing signal from source 14 may be applied to body 10 in any way which gain modulates the elastic wave amplification of noise therein. FIGS. 4 through 7 illustrate several alternative connections. In FIG. 4 the alternating current signal from source 41 is connected in series with direct current source 42 between contacts 11 and 12. In FIG. 5 the alternating current source 51 is applied with a separate contact 52 through condenser 53 to a portion of body 10 that is only partially coextensive with the direct current field from source 54. Separate pairs of contacts may also be used that apply fields that are coextensive or noncoextensive. In FIG. 6 the alternating current signal from source 61 is converted into a low frequency elastic wave by a transducer 62 of any suitable design. For example, transducer 62 may be a piezoelectric crystal with a usual pair of electrodes. The elastic wave in turn is launched into body 10 where it varies slightly the physical length of body 10 about a mean length and its acoustical Q about a mean value. These variations have the effect of varying the elastic wave gain around a center frequency. In FIG. 7 body 10 is formed of cadmium sulphide or gallium arsenide, either of which are photosensitive, so that the resistivity of body 10 depends upon the extent of its optical illumination. The alternating current signal from source 71 is applied to modulate a suitable illuminating source 72 such as a sodium vapor light, to vary the resistivity of body 10 which in turn varies the carrier concentration in body 10 which is equivalent to varying the electric field developed along it by source 63, and therefore varies the elastic wave gain.

In order to illustrate the relative orders of magnitude of the parameters involved, a practical embodiment according to the form illustrated in FIG. 1 comprises a rectangular body of single crystal cadmium sulphide 1.0 millimeter in cross section and 0.5 centimeters long along the C-axis. Such a body has a value of $v_s$ equal to $175\times10^5$ centimeters per second for a shear wave normal to the C-axis. The alternating current synchronizing signal would therefore be of a frequency of 175 kilocycles per second and should have an amplitude of about 10 volts. By applying a direct current potential of 550 volts along the length of the crystal modes of oscillation having a net gain extend from 92 megacycles ($n$=520) to 460 megacycles ($n$=2600). Elastic wave energy may be coupled out at any mode within this range spaced from each other by 175 kilocycles.

In all cases it is to be understood that the above-described arrangements are merely illustrative of a small number of the many possible applications of the principles of the invention. Numerous and varied other arrangements in accordance with these principles may readily be devised by those skilled in the art without departing from the spirit and scope of the invention.

What is claimed is:

1. Means for generating elastic wave energy of given frequency and wavelength comprising an elongated body of length equal to an integral multiple of half wavelengths of said given wavelength, said body having both piezoelectric and semiconductive properties, means for establishing a direct current field along the length of said body that is modulated at an integral submultiple of said given frequency.

2. An elastic wave device comprising an elongated body having both piezoelectric and semiconductive properties, means for establishing a direct current field along said body having such amplitude and direction that elastic waves in said body are increased in amplitude in a given degree, means for coupling elastic wave energy from said body at a desired frequency, and means for modifying said given degree of amplitude increase at a frequency that is small compared to and an integral submultiple of said desired frequency.

3. The device according to claim 2 wherein said degree of amplitude increase is modified by modifying said direct current field.

4. The device according to claim 3 wherein said body has a length that is an integral multiple of elastic half wavelengths in said body of said desired frequency.

5. The device according to claim 3 wherein the length of L of said body is substantially equal to $ny_s/2f_n$ and said field is modified at a frequency substantially equal to $y_s/2L$ wherein $y_s$ is the velocity of sound in said body, $f_n$ is said desired frequency and $n$ is an integer.

6. The device according to claim 3 wherein said field is modified by an alternating current applied in parallel with said direct current field.

7. The device according to claim 3 wherein said field is modified by an alternating current applied to a portion of said body.

8. The device according to claim 3 wherein said body is photosensitive and said field is modified by an intensity varying source of light illuminating said body.

9. The device according to claim 2 wherein said body is modified in length and acoustical Q by an elastic wave transmitted into said body at a frequency that is small compared to said desired frequency.

References Cited

UNITED STATES PATENTS

| | | | |
|---|---|---|---|
| 3,173,100 | 3/1965 | White | 330—35 |
| 3,185,942 | 5/1965 | White | 310—8 |
| 3,274,406 | 9/1966 | Sommers | 310—8.1 |
| 3,293,557 | 12/1966 | Denton | 310—8.1 |
| 3,321,647 | 5/1967 | Tien | 310—8.1 |

J. D. MILLER, *Primary Examiner.*